(12) United States Patent
Schmid

(10) Patent No.: US 10,197,620 B2
(45) Date of Patent: Feb. 5, 2019

(54) ELECTRIC CONTACT DEVICE

(71) Applicant: FEINMETALL GMBH, Herrenberg (DE)

(72) Inventor: Rainer Schmid, Pliezhausen (DE)

(73) Assignee: FEINMETALL GMBH, Herrenberg (DE)

( * ) Notice: Subject to any disclaimer, the term of this patent is extended or adjusted under 35 U.S.C. 154(b) by 0 days.

(21) Appl. No.: 15/552,343

(22) PCT Filed: Feb. 15, 2016

(86) PCT No.: PCT/EP2016/053166
§ 371 (c)(1),
(2) Date: Aug. 21, 2017

(87) PCT Pub. No.: WO2016/139054
PCT Pub. Date: Sep. 9, 2016

(65) Prior Publication Data
US 2018/0045774 A1 Feb. 15, 2018

(30) Foreign Application Priority Data
Mar. 3, 2015 (DE) .................... 20 2015 001 622 U

(51) Int. Cl.
*G01R 31/28* (2006.01)
*G01R 1/073* (2006.01)

(52) U.S. Cl.
CPC ..... *G01R 31/2831* (2013.01); *G01R 1/07342* (2013.01); *G01R 31/2808* (2013.01); *G01R 1/07357* (2013.01)

(58) Field of Classification Search
CPC ............ G01R 31/2831; G01R 1/07342; G01R 31/2808; G01R 1/07357
See application file for complete search history.

(56) References Cited

U.S. PATENT DOCUMENTS 4,862,077 A * 8/1989 Horel ................. G01R 1/07342
324/754.07
4,901,013 A * 2/1990 Benedetto .......... G01R 1/07357
324/73.1

(Continued)

FOREIGN PATENT DOCUMENTS

| EP | 1956376 A1 | 8/2008 |
| EP | 2026078 A1 | 2/2009 |
| WO | WO-01/79867 A1 | 10/2001 |

OTHER PUBLICATIONS

English Translation of the International Preliminary Report on Patentability for PCT/EP2016/053166, IB, Geneva, dated Sep. 8, 2017.

(Continued)

*Primary Examiner* — Daniel Miller
(74) *Attorney, Agent, or Firm* — Stephen T. Olson; Harness, Dickey & Pierce, P.L.C.

(57) ABSTRACT

A contact device for an electric contact for electrically testing an electric test object, comprising a contact head and at least one printed circuit board. The contact head has a plurality of guide bores in which elongated contact elements that buckle elastically in a lateral direction upon contacting the test object are mounted in a longitudinally movable manner. One end of the contact element is used to contact the test object and the other end is in contact with first contact surfaces which are arranged in a specified pattern and which are located on a face of the printed circuit board in a first, central region of the printed circuit board face. Second contact surfaces are arranged in a further specified pattern, are electrically connected to the first contact surfaces through the printed circuit board, and lie on the other face of the printed circuit board in a second, central region of the printed circuit board face. Third contact surfaces lie on the other face of the printed circuit board in at least one first (Continued)

peripheral portion of the printed circuit board face. At least some of the second contact surfaces are electrically connected to at least some of the third contact surfaces by bonded bonding wires. At least some of the first contact surfaces and/or at least some of the second contact surfaces are each electrically connected to one another by severable conductors, and at least one of which is severed.

19 Claims, 5 Drawing Sheets

(56) References Cited

U.S. PATENT DOCUMENTS

| | | | |
|---|---|---|---|
| 6,255,602 B1 * | 7/2001 | Evans | G01R 1/07378 174/261 |
| 2010/0001748 A1 | 1/2010 | Sasaki et al. | |

OTHER PUBLICATIONS

International Search Report for PCT/EP2016/053166, ISA/EP, Rijswijk, NL, dated May 19, 2016.
Written Opinion of the ISA for PCT/EP2016/053166, ISA/EP, Rijswijk, NL, dated May 19, 2016.
International Preliminary Report on Patentability with annexes and their translation for PCT/EP2016/053166, IPEA, Munich, dated Jun. 14, 2017.

* cited by examiner

ELECTRIC CONTACT DEVICE

CROSS-REFERENCE TO RELATED APPLICATIONS

This application is a 371 U.S. National Stage of International Application No. PCT/EP2016/053166, filed Feb. 15, 2016. This application claims the benefit of and priority to German Patent Application No. 20 2015 001 622.7, filed Mar. 3, 2015. The entire disclosures of the above application are incorporated herein by reference.

DESCRIPTION

The invention relates to a contact device for an electric contact for electrically testing an electric test object, particularly a wafer.

Contact devices of the initially described type are known. They are used to contact an electric test object, particularly a wafer in order to test it for electrical functionality. The contact distances of the test object are in many cases extremely small. For this reason, it is necessary that the contact device enlarges the contact distance such that a test device can be connected in most cases by means of cable connections, with the help of which the electrical functionality of the test object is examined. By means of the contact device, the test device connects test circuits by including the test object, thus allowing for a statement about its functionality. This is aggravated by the fact that such a test must be conducted within a wide temperature range in order to be able to also attest to the functionality of the test object for each of the selected temperature ranges. However, great temperature differences also lead to contact problems, particularly due to temperature-related shifts of parts relative to one another caused by different temperature expansion coefficients. Furthermore, it has been necessary for each test object to produce an individually designed contact device, with which the test can be conducted because the contact patterns of different test objects vary. The individual production of such contact devices is expensive and frequently time consuming. The aforementioned known contact device has a manually produced and soldered wiring which "widens" the very narrow contact arrangement in the test object, thus contributing to the fact that correspondingly greater contact distances are present which allow for the test device to be electrically connected. Once the wiring of the known contact device is completed, the wires of the wiring are attached by infusion, preferably by means of a plastic resin. The different, particularly manual work steps are elaborate and are prepared individually differently, depending on the skill of the acting employee and his/her work method. These individual differences result in contact devices, particularly probe cards, of the same type with different electric properties, depending on the processing quality of the employee. The aforementioned manually soldered wiring requires trained employees who are able to perform these delicate tasks. Such employees are frequently not available in sufficient numbers. Due to a constantly increasing wiring density, wiring errors can easily occur during the manual work, and the wiring speed decreases because the high wiring density is confusing and also influences the concentration of the employees. If electric components, e.g. capacitors, are included in the wiring, the work is becoming even more complicated.

The problem addressed by the invention is thus that of creating a contact device for an electric contact for electrically testing an electric test object, particularly a wafer which has a consistently high quality, particularly with regard to its electric properties, which can be produced free from errors and requires a relatively short production time. Furthermore, at least sections of the contact device are supposed to be standardized in order to make individual adjustments to the test object as simple as possible and less elaborate, and so standard components can be produced and stored and in case of an order can be easily and quickly adjusted to the individual test object. Lastly, the contact device is supposed to be able to incorporate electric components in a simple manner, if needed.

In a contact device for an electric contact for electrically testing an electric test object, in particular a wafer, this problem is solved in that it comprises a contact head and at least one printed circuit board, wherein the contact head has a plurality of guide bores, in which elongated contact elements that buckle elastically in a lateral direction upon contacting the test object, are mounted in a longitudinally movable manner; one end of the contact element is used to contact the test object and the other end is in contact with first contact surfaces which are arranged in a specified pattern and which are located on a face of the printed circuit board in a first, particularly central region of the printed circuit board face, wherein second contact surfaces which are arranged particularly in a further specified pattern and which are electrically connected to the first contact surfaces through the printed circuit board lie on the other face of the printed circuit board in a second, particularly central region of the printed circuit board face; third contact surfaces lie on the other face of the printed circuit board in at least one first particularly peripheral portion of the printed circuit board face; at least some of the second contact surfaces are electrically connected to at least some of the third contact surfaces by means of bonded bonding wires; and wherein at least some of the first contact surfaces and/or at least some of the second contact surfaces are each electrically connected to one another by means of severable conductors, and at least one of said conductors is severed. The contact device according to the invention thus comprises—as seen looking from the test object—the following electric contact path: The contact elements of the test head are used as contact of the test object contacts and are in contact with the first contact surfaces of the printed circuit board. The first contact surfaces are connected to the second contact surfaces of the printed circuit board, which are located on a face of the printed circuit board which is facing away from the test object. They are located particularly centrally and are connected to third contact surfaces, which are located in the at least one, particularly peripheral portion of the printed circuit board, by means of bonded wires (bonding wires). In the particularly peripheral portion of the printed circuit board, there is significantly more space available than in the preferably central region, and so a contact distance enlargement takes place by means of the wiring formed by the bonding wires. The peripheral portion can extend particularly around the central region. The bonding can preferably be effected automatically, and so no manual labor is required thereto. The respective starting and target coordinates for the bonding wires can be entered with computer support. The bonding, particularly automatic/machine bonding, results in optimal electric properties with consistently high quality. Wiring errors are avoided. The employees entrusted with the manufacture of the contact device are insofar no longer burdened with the aforementioned delicate tasks. Since at least some of the first contact surfaces and/or at least some of the second contact surfaces are each electrically connected to one another by means of severable conductors and at least one of said conductors is severed, it is possible, depending on the position and number of the severed conductor(s), to produce conductor surfaces/conductor structures which can be customer-specifically requested and/or be available for the same electric potential. Similar electric signals can thus be combined. It is very advantageous if electric/electronic components, e.g. capacitors, are placed on these conductor surfaces, provided they are not otherwise used; as a result, these components are arranged very closely to the test object and thus work particularly free of interference. The starting point is at least some of the electrically connected contact surfaces which are then individually adjusted by severing of one or more conductors. By appropriate severing of the conductors, the aforementioned electric conductor surfaces/conductor structures can be created either on one face of the printed circuit board due to the first contact surfaces, or on the other face of the printed circuit board by means of the second contact surfaces located on said face, or on both sides of the printed circuit board. Connected conductor surfaces/conductor structures, for example, can be used very advantageously for feeding a potential of a voltage supply and/or for the ground potential.

In a development of the invention, the severable conductors are configured as conductor paths or conductor webs. The conductor paths are preferably arranged on and/or below (i.e. within the printed circuit board) of the surface of one and/or the other face of the printed circuit board. Preferably, the first and/or second contact surfaces can also be configured as corresponding conductor path elements and preferably be located on one and/or the other face of the printed circuit board. The conductor webs are conductors that run above the surface of the first and/or the second face of the printed circuit board.

In particular, the at least one severed conductor is severed by a laser. In order to separate said conductor surfaces, i.e. contact surfaces connected by conductor paths or conductor webs, the suitable conductors, which connect contact surfaces with one another, are severed, particularly by means of a laser. This laser-severing can preferably be effected automatically, i.e. the laser performing the severing is fed with corresponding coordinate data sets, and so the laser can work automatically.

A development of the invention is characterized by at least one conductor board, wherein the third contact surfaces are electrically connected to conductor arrangements of the conductor board. Above, next to and/or below the at least one printed circuit board, the at least one conductor board is arranged. It is used to further enlarge the contact distance and provides an optional connection to the test device. Preferably, electric cable connections and/or contacts are established between the conductor board and the test device. The third contact surfaces located on the other face of the printed circuit board are electrically connected with corresponding conductor arrangements of the conductor board. The electric connection between the third contact surfaces and the conductor board can be configured in different ways as it becomes apparent from the entirety of this intellectual property application. Connections known to a person skilled in the art can also apply, even if they are not contained in this intellectual property application.

In a development of the invention, first contact components lie on the one face of the printed circuit board in at least one second, particularly peripheral portion, said contact components being electrically connected through the printed circuit board to the third contact surfaces; the conductor board comprises two contact components on the side facing the printed circuit board, and wherein the first contact components are electrically connected to the second contact components by means of electric connections, particularly elastically resilient contacts. In particular, the conductor board is located in a position closer to the test object than the printed circuit board. From the third contact surfaces, there are electric connections to the one opposite face of the printed circuit board as far as the first contact components present at that location which are electrically connected by elastically resilient contacts to the second contact components of a conductor board. The elastic resilience allows in a correspondingly larger area a variation in the test object-dependent/manufacture-dependent/user-dependent design height which is defined by the axial distance between the ends of the contact elements used to contact the test object and the face of the printed circuit board facing the test object. The axial direction of the axial distance is defined along the longitudinal extension of the elongated contact elements (in this case, the elastic buckling in lateral direction of the contact elements when making contact is not taken into account). Even if, due to different manufacturers/ users of test objects to be tested, said ends of the contact elements have different measurements with regard to said face of the printed circuit board, i.e. the design height, any test object can be tested with one and the same contact device because the elastic resilience of the contacts with regard to the first and second contact components allows for an adjustment of different design heights to the contact device, and so in that respect it can be used universally.

Preferably, in a further embodiment, first contact components lie on the other face of the printed circuit board in at least one second, particularly peripheral portion of it, which are electrically connected to the third contact surfaces; the conductor board comprises second contact components on the side facing the printed circuit board, and wherein the first contact components are electrically connected to the second contact components by means of electric connections, particularly elastically resilient contacts. In particular, the conductor board is located in a position closer to the test object than the printed circuit board. The description in the previous paragraph applies correspondingly to the embodiment of this paragraph.

According to a development of the invention, the first contact components are electrically connected to the second contact components by means of at least one electric interposer. This interposer can preferably be configured as a separate component and/or is formed or additionally formed by parts of the printed circuit board and/or conductor board.

In particular, the first contact components and/or the second contact components can be fourth contact surfaces. These fourth contact surfaces are thus located on the face of the printed circuit board facing the test object and/or on the side of the conductor board facing away from the test object.

According to a development of the invention, the first contact components and/or the second contact components are protruding first spring contacts. In this embodiment, there are thus no contact surfaces provided which have to be connected by means of the interposer, but the first and/or second contact components are raised elements, i.e. protruding first spring contacts, i.e. elastically resilient elements. The first spring contacts of the first and second contact components can be in direct contact, or a third object is interposed.

It is advantageous if the interposer comprises contact means on opposite sides which are configured as fifth contact surfaces and/or protruding second spring contacts. If the first and second contact components are designed as fourth contact surfaces, and the interposer located between these first and second contact components comprises contact means on opposite sides, which are configured as protruding second spring contacts, a fourth contact surface of the printed circuit board is in contact with a fourth contact surface of the conductor board, wherein these two second spring contacts are electrically connected to one another.

In a development of the invention, the specified pattern of the arrangement of the first contact surfaces and/or the particularly specified pattern of the second contact surfaces is each a two-dimensional matrix pattern. The contact surfaces are thus arranged to form a checkered pattern. In a corresponding arrangement, the ends of the contact elements facing away from the test object are placed such that a flawless electric contact between these components is ensured during a test procedure of the electric test object. Additionally or alternatively, the second contact surfaces can be arranged in a further two-dimensional pattern. In a development of the invention, the guide bores are arranged in the region of the printed circuit board in the specified pattern, particularly a two-dimensional matrix pattern. This has already been described directly above.

Preferably, the guide bores on the side of the test object are arranged in an individual pattern which corresponds to the test object. For example, if guide bores are provided in a first guide plate, which faces away from the test object, and guide bores are provided in a second guide plate which is spaced apart from the first guide plate and is located in the region near the test object, this results in guide bores that are located in a specified pattern according to the first contact surfaces, and in an individual pattern which is predetermined by the contact arrangement of the test object. As a result, not all of the elongated contact elements extend in axial direction, but at least some of them run obliquely to said axial direction in order to be able to transition from the individual pattern to the specified pattern, particularly the two-dimensional matrix pattern. With this design, it is possible to manufacture a multiplicity of the components of the contact device described herein without having to address the test object or customer-specific requirements. Only with the aforementioned possibility of creating a transition between the individual pattern and the specified pattern is it possible to adjust such contact devices to the individual case. The same applies to the aforementioned adjustment of the design height.

In a development of the invention, the first contact surfaces are connected to the second contact surfaces by means of first through-connections. As a result, the printed circuit board, which can also be called daughterboard, having particularly a conductor board-corresponding structure, is interspersed by the first through-connections, thus electrically connecting the first contact surfaces with the second contact surfaces. The printed circuit board and/or the conductor board can be configured as a single-layer or multi-layer structure.

In particular, at least some of the first through-connections are composed of a plurality of first through-connection areas, wherein for these first through-connections, the first through-connection areas each lie aligned and/or offset, but at least to some extent overlapping to one another. The individual through-connection areas are thus designed so as to be strung together to create an electric connection, wherein in case of through-connection areas aligned to one another, the position of the first contact surface is axially aligned to the associated second contact surface. However, if at least some of the first through-connection areas of such a through-connection are arranged offset to one another, while a partial overlapping is retained, the electric contact path runs obliquely. As a result, particularly the contact distance can be enlarged, i.e. the first contact surfaces have a narrower contact distance to one another than the second contact surfaces. This does not have to apply to all such contact surfaces, but it applies to at least some of them. Insofar, the bonding of the bonding wires to be performed on the second contact surfaces is made easier due to a greater contact distance.

In a development of the invention, the third contact surfaces are connected to the first contact surfaces by means of second through-connections. As described above, the second through-connections can be used to either enlarge the contact distances or not enlarge them.

The contact distances are enlarged if at least some of the second through-connections are composed of a plurality of second through-connection areas, wherein for these second through-connections, the second through-connection areas each lie aligned and/or offset, but at least to some extent overlapping to one another. The aforementioned first through-connection areas can be understood particularly in the context of a layer structure of the printed circuit board, i.e. it is a so-called multilayer board, wherein a through-connection area is associated with each layer.

Advantageously, the second contact surfaces and the third contact surfaces are at the same height. As a result, the face of the printed circuit board facing the test object forms a plane. Due to said plane and the resulting position of the second and third contact surfaces, bonding becomes particularly effective and simple.

Particularly, at least one replaceable spacer element of selectable thickness is arranged between printed circuit board and conductor board for adjusting the height distance of printed circuit board and conductor board. Depending on the selected spacer element, i.e. correspondingly thick spacer element, the so-called, previously described design height of the contact device can be adjusted, and so manufacturer-specific/user-specific requirements with regard to the test objects can be realized with one and the same device.

According to a development of the invention, the contact elements are microsystem-technical contact elements. These are components with the smallest measurements (in the micrometer range). Microsystem technology is also termed MEMS.

Preferably, the third contact surfaces, the first contact components, the second contact components and/or the contact means are each electrically connected to one another by means of severable, particularly laser-severable conductors, wherein at least one of these conductors is severed, particularly laser-severed. For example, in order to create areas of the same electric potential, e.g. at a plurality of contact surfaces, they can be electrically connected to one another by means of the conductors. However, if specific third contact surfaces are to be separated from specific other contact surfaces, or also only one third contact surface is to be separated correspondingly, the at least one or the at least plurality of conductors connected to this (these) contact surface(s) are severed during the manufacture of the contact device, and so there is no connection to adjacent third contact surfaces. The severing can be accomplished with different techniques, particularly preferably by means of a laser beam. The laser can be machine-controlled/software-controlled, and so no manual labor is required. For example, in this manner, a larger contact region with an electric ground potential can be created and/or a contact region not required for the buckling contact elements can be separated and thus be available, e.g. to receive an electric/electronic components. The same applies to the first contact surfaces, the second contact surfaces, the first contact components, the second contact components and/or the contact means.

Lastly, it is advantageous if the conductors are arranged in the form of a matrix. If the aforementioned contact surfaces, contact components and/or contact means are arranged in a specified or further specified pattern, e.g. in the form of a matrix, the result is a corresponding conductor arrangement, i.e. a correspondingly specified pattern, particularly also in the form of a matrix. For example, it is possible to connect contact areas, contact components and/or contact means arranged in a checkered pattern such that the conductors run in X- and Y-direction of a plane, on which the contact areas, contact components and/or contact means are located.

With the contact device according to the invention, a method for an electric contact for electrically testing an electric test object, particularly a wafer, can be executed, wherein the contact device comprises a contact head and at least one printed circuit board, wherein the contact head has a plurality of guide bores, in which elongated contact elements that buckle elastically in a lateral direction upon contacting the test object, are mounted in a longitudinally movable manner; one end of the contact element is used to contact the test object and the other end is in contact with first contact surfaces which are arranged in a specified pattern and which are located on a face of the printed circuit board in a first, particularly central region of the printed circuit board face, wherein second contact surfaces which are arranged particularly in a further specified pattern and which are electrically connected to the first contact surfaces through the printed circuit board lie on the other face of the printed circuit board in a second, particularly central region of the printed circuit board face; third contact surfaces lie on the other face of the printed circuit board in at least one first particularly peripheral portion of the printed circuit board face; wherein at least some of the second contact surfaces are electrically connected to at least some of the third contact surfaces by means of bonded bonding wires; and wherein at least some of the first contact surfaces and/or at least some of the second contact surfaces are each electrically connected to one another by means of severable conductors, and at least one of the conductors is severed, particularly laser-severed.

The drawings illustrate the invention using embodiments.

Figure 1:
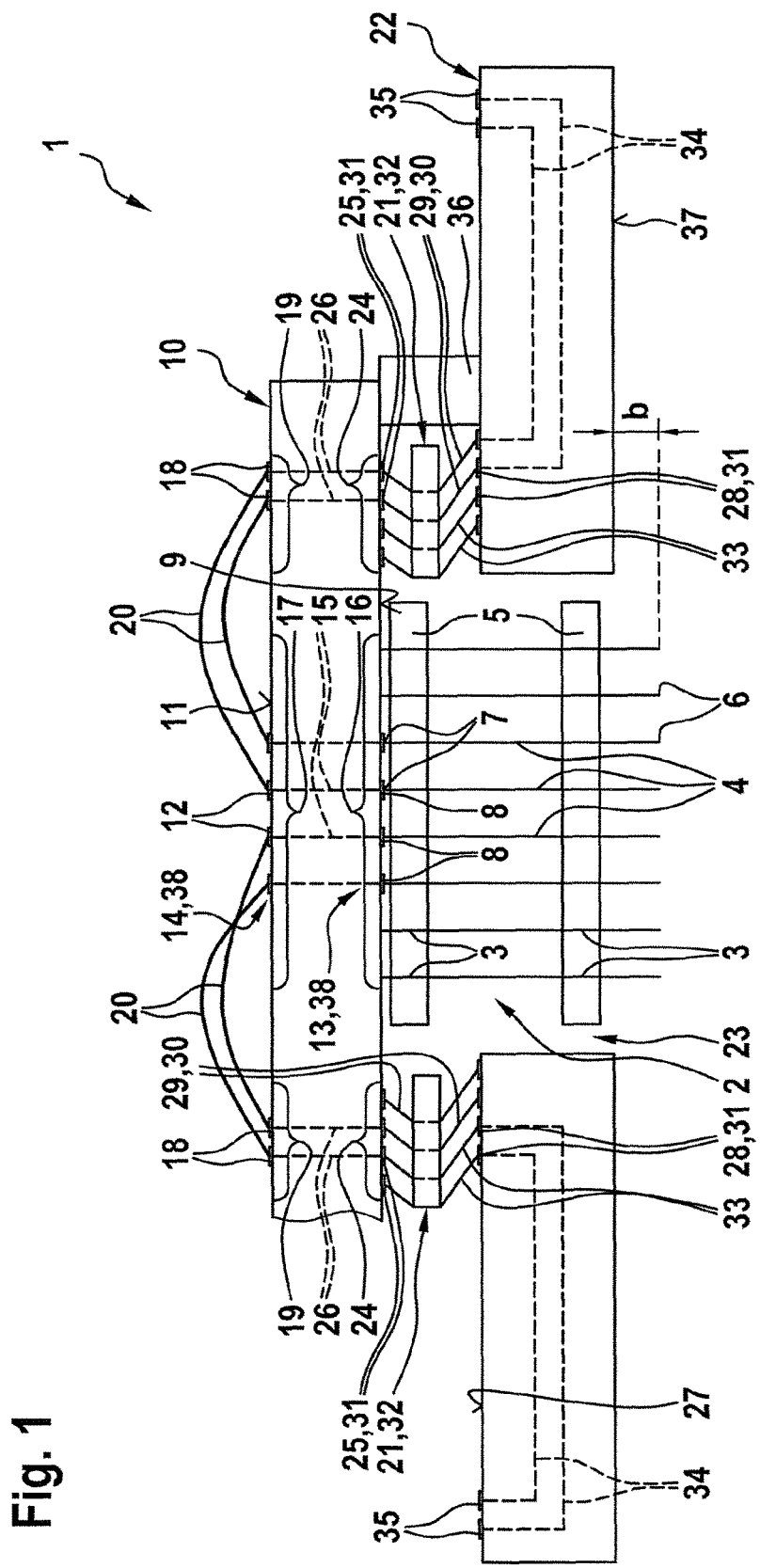
FIG. 1 shows a schematic, partially sectional view of a contact device.

FIG. 1 shows a contact device 1. The contact device 1 is used to electrically contact an electric test object, particularly a wafer, for electrically testing said test object. For that purpose, the contact device 1 comprises a contact head 2, which is provided with a plurality of guide bores 2, in which elongated contact elements 4 are mounted in a longitudinally movable manner. In the schematic depiction of FIG. 1, the contact head 2 comprises two guide plates 5 which are spaced apart from one another, and are interspersed by the aforementioned guide bores 3. However, other embodiments with more than two guide plates 5 are conceivable. The one ends 6 of the contact elements 4 are used to electrically contact a test object not depicted in FIG. 1. The other ends 7 of the contact elements 4 contact the contact surfaces 8 which are located on a face 9 of a printed circuit board 10. If the test object is electrically contacted, it results in a lateral elastic buckling of the elongated contact elements 4, i.e. they consist of elastic, electrically conducting material. The contact elements 4 are frequently also called buckling wires.

The printed circuit board 10 having the contact surfaces 8 on one face 9 also comprises contact surfaces 12 on another face 11 which is opposite of the face 9. For differentiation purposes, the contact surfaces 8 shall be denoted as first contact surfaces 8, and the contact surfaces 12 shall be denoted as second contact surfaces 12. The first contact surfaces 8 are arranged in a specified pattern 13 on the one face 9 of the printed circuit board 10. This is a pattern 13 that lies in a plane. The second contact surfaces 12 located on the other face 11 of the printed circuit board 10 are arranged in a further specified pattern 14. This is also a pattern that lies in a plane. The pattern 14 can be designed similar to the pattern 13 or there can be differences between the two patterns 13 and 14. One first contact surface 8 each is electrically connected to an assigned second contact surface 12. For that purpose, electric connections 15 are provided which intersperse the printed circuit board 10. The first contact surfaces 8 are located on the one face 9 of the printed circuit board 10 in a first region 16 which particularly forms a central region of the printed circuit board 10. The second contact surfaces 12 on the other face 11 are located in a second region 17 of the printed circuit board 10, wherein the second region 17 particularly forms a central region of the printed circuit board 10.

Figure 2:
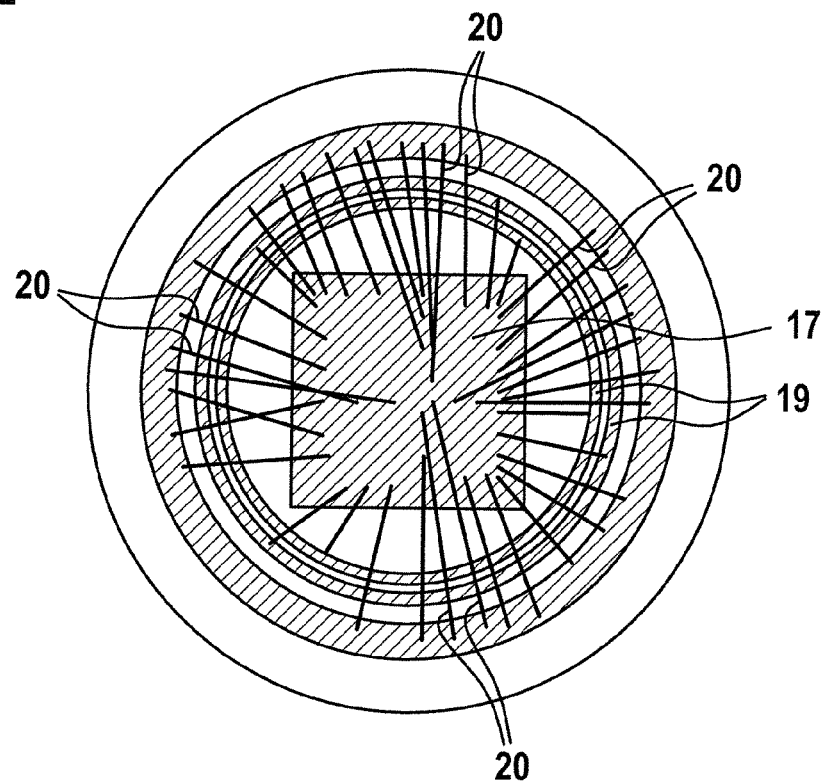
FIG. 2 shows a top view of a printed circuit board of the arrangement in FIG. 1.

On the face 11 of the printed circuit board 10, third contact surfaces 18 are arranged. The third contact surfaces 18 are located in a first portion 19 of the face 11 which particularly forms a peripheral portion 19 of the face 11. The arrangement is preferably selected such that the first portion 19 extends around the second region 17 as can be seen particularly from the top view of FIG. 2. The first portion 19 can—as seen in FIG. 2—be divided into a plurality of sections. In the embodiment of FIG. 2, three annular sections are present which are concentric to one another, wherein the second central region 17 is located within the annular sections.

Figure 3:
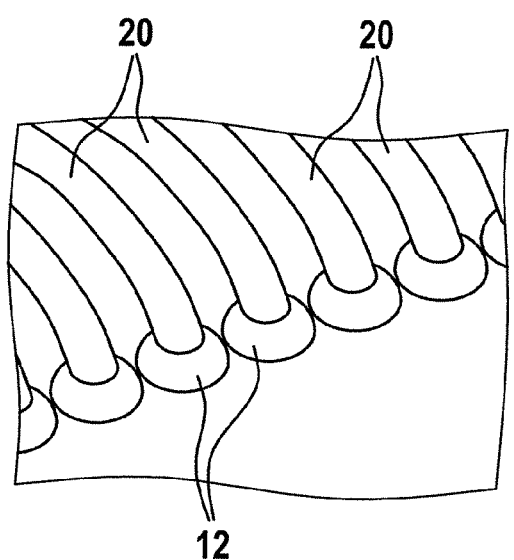
FIG. 3 shows a section from FIG. 1 but as a perspective view.

At least some of the second contact surfaces 12 are electrically connected to at least some of the third contact surfaces 18 by means of bonded bonding wires 20. The bonding wires 20 are preferably arch-shaped as can be seen in FIG. 1. FIG. 2 illustrates that the bonding wires 20—beginning from the second, particularly central region 17—extend approximately radially to the first, preferably peripheral portion 19. FIG. 3 shows a detailed view. It can be clearly seen how the bonding wires 20 are electrically connected with their ends through bonding to the second contact surfaces 12.

By means of electric means 21, the third contact surfaces 18 are connected to at least one conductor board 22. In the embodiment of FIG. 1, a conductor board 22 is present, having a central opening 23, in which the contact head 2 is located. The arrangement is preferably selected such that on the one face 9 of the printed circuit board 10 in at least a second, particularly peripheral portion 24 of the printed circuit board 10, first contact components 25 are located which are electrically connected to the third contact surfaces 18. These electric connections 26 extend through the printed circuit board 10. On the side 27 of the conductor board 22, which faces the printed circuit board 10, two contact components 28 are located. The first contact components 25 are electrically connected to the second contact components 28 by means of electric connections 29, particularly elastically resilient contacts 30. The aforementioned electric means 21 thus electrically connect the printed circuit board 10 with the conductor board 22. Particularly, it is possible that the first contact components 25 and/or the second contact components 28—as shown in FIG. 1—are configured as fourth contact surfaces 31. According to FIG. 1, the arrangement is selected such that the electric means 21 are connected by means of at least one electric interposer 32. On opposite sides, the electric interposer 32 comprises contact means which are designed as second spring contacts 33. These elastically resilient spring contacts 33 are thus in contact with the fourth contact surfaces 31. Alternatively, it is also possible that an interposer is used which has contact means on opposite sides and which are designed as fifth contact surfaces. In such case, the first contact components 25 and the second contact components 28 of the printed circuit board 10 and the conductor board 22 are configured as protruding first spring contacts.

The second contact components 28, particularly the fourth contact surfaces 31 of the conductor board 22, are connected to the fifth contact surfaces 35 of the conductor board 22 by means of electric connections 34. The second contact components 28, particularly the fourth contact surfaces 31, lie, with regard to the conductor board 22, in a central region of said conductor board 22, particularly around the opening 23. The fifth contact surfaces 35 lie in a peripheral portion of the conductor board 22. By means of cable connections (not depicted), the fifth contact surfaces 35 are electrically connected to a test device (not depicted).

Due to the structure of the contact device 1 shown in FIG. 1, the extremely small distance present between the contact elements 4 can be enlarged to a sufficiently large distance of the fifth contact surface 35, and so, e.g. the soldering required for connecting the test device can be performed without problems at the fifth contact surfaces 35.

FIG. 1 shows schematically that the second contact surfaces 12 lie at the same height as the third contact surfaces 18, and so the work for bonding the bonding wires 20 can be performed on one plane. Furthermore, FIG. 1 shows schematically that for the adjustment of the height distance of printed circuit board 10 and conductor board 22, at least one replaceable spacer element 36 of selectable thickness is arranged between printed circuit board 10 and conductor board 22. This results in a corresponding measurement of a design height b between the ends 6 of the contact elements 4 and the side 37 of the conductor board 22 which faces the test object. Depending on the selected thickness of the spacer element 36, the design height b can be varied accordingly in order to be able to meet specific guidelines of the different users of the contact device 1. Due to the elastically resilient electric connections 21 between the printed circuit board 10 and the conductor board 22, good electric contact between the printed circuit board 10 and the conductor board 22 is invariably ensured despite a variation in design height b.

Figure 4:
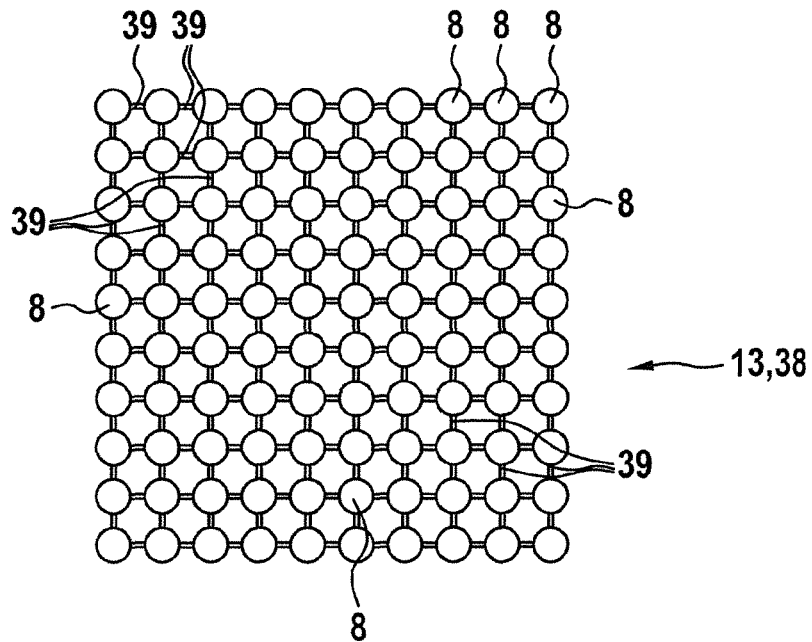
FIGS. 4 and 5 show sections from the arrangement of FIG. 2 in the initial state and in the processed state.
Figure 5:
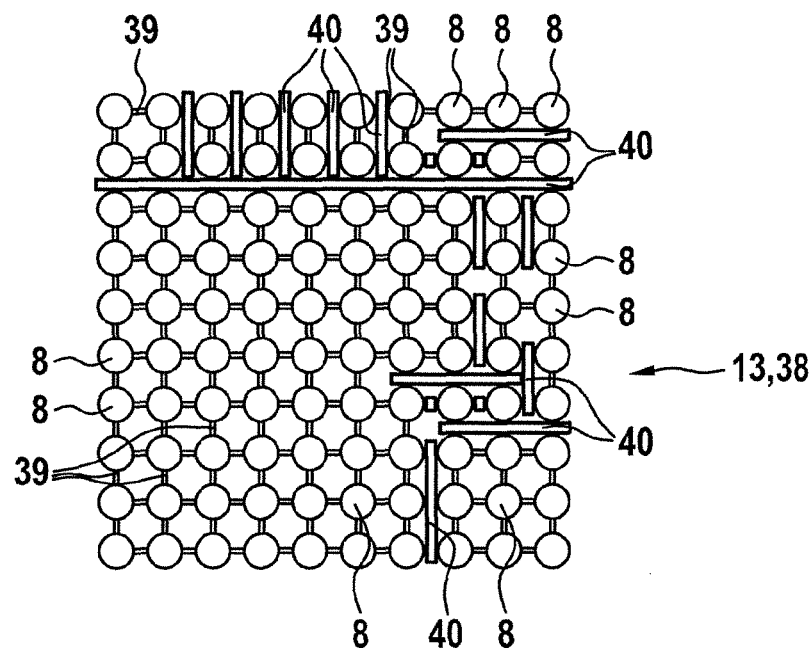

FIGS. 4 and 5 show the arrangement of the first contact surfaces 8 in the specified pattern 13. Preferably, the second contact surfaces 12 can be arranged in a further specified pattern 14 which is designed similar to pattern 13. In the following, reference shall only be made to the first contact surfaces 1, wherein the same shall apply correspondingly to the second contact surfaces 12 but shall not be described separately.

According to FIG. 4, the specified pattern 13 is a two-dimensional matrix pattern 38, i.e. the first contact surfaces 8 are distributed in a checkered pattern, but they do not directly bear against each other and are instead electrically connected to one another by means of electric conductors 39. FIG. 4 shows the status, in which all first contact surfaces 8 are connected to one another by means of electric conductors 39 running in x- and y-direction. The electric conductors 39 are also arranged in a matrix-like pattern. The state shown in FIG. 4 is an initial state, i.e. it is not suitable for performing the electric test of the test object because all first contact surfaces 8 are short-circuited among each other. For adjusting to the electric circuit of the test object, at least one of the conductors 39 is severed, particularly laser-severed. The rectangular boxes shown in FIG. 5 indicate the severing, particularly laser-severing of the corresponding conductors 8. In this manner, corresponding current paths are formed between the test object and the test device, wherein, according to FIG. 5, larger surfaces can also be retained which are electrically connected, i.e. have no severed conductors 39. These surfaces can be used, for example, to arrange electric/electronic components which are electrically connected to corresponding first contact surfaces 8. FIG. 5 thus illustrates the operational state of the contact device 1 with regard to the first contact surfaces 8. The electric conductors 39 can be configured as conductor paths or conductor webs. The severing, particularly laser-severing 40 separates corresponding first contact surfaces 8 or a plurality of first contact surfaces 8 from adjacent first contact surfaces 8. This way, it is particularly possible to form current paths for feeding an electric supply potential and/or create ground areas.

The bonding of the bonding wires 20 and/or the severing, particularly laser-severing of the electric conductors 39 is both preferably effected fully automatically, i.e. software-controlled machines are used which perform the appropriate tasks automatically.

Figure 7:
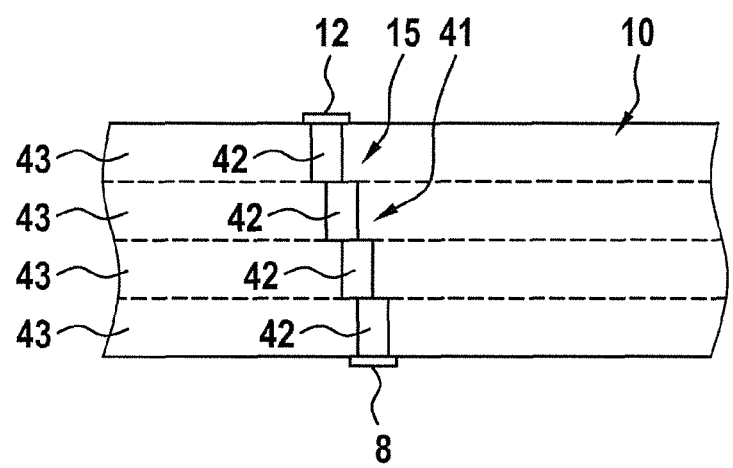
FIG. 7 shows a sectional view through an area of the printed circuit board according to FIG. 1 and according to FIG. 6.

FIG. 7 illustrates the design of the electric connections 15 and/or the electric connections 26. It shows an electric connection 15 of the printed circuit board 10. The embodiment described in the following applies accordingly to the electric connections 26. It is basically possible that the electric connection 15 intersperses the printed circuit board 10 in a straight line, i.e. in a direction which corresponds to the longitudinal extension of the contact elements 4 (without taking into account their lateral rebounding and/or slanting). However, in order to achieve an enlargement of the contact distance between the first contact surfaces 8 and the second contact surfaces 12, an obliquely outward extending course according to FIG. 7 can also be provided. Particularly the first contact surfaces 8 are connected to the second contact surfaces 12 by means of first through-connections 41. The through-connection shown in FIG. 7 comprises a plurality of first through-connection areas 42. One through-connection area 42 each extends through a layer 43 of the printed circuit board 10 structured as a multilayer board. The arrangement is selected such that the first through-connection areas 42 lie offset but at least to some extent overlapping to one another, resulting in the aforementioned "oblique course" and resulting in an enlargement of the contact distance.

Correspondingly—as described for FIG. 7—the third contact surfaces 18 can be connected to the first contact components 25 by means of the second through-connections, wherein at least some of the second through-connections are each composed of a plurality of second through-connection areas, and wherein at these second through-connections, the second through-connection areas each lie aligned and/or offset but at least to some extent overlapping to one another.

Preferably, it is possible that the specified pattern 13, particularly the two-dimensional matrix pattern 38, corresponds to the arrangement of the guide bores 3 in the area of the printed circuit board 10. This design is thus present for the guide plate 5 which lies closely adjacent to the printed circuit board 10. For the other guide plate 5, which lies closely to the ends 6 of the contact elements 4, i.e. on the side of the test object, the guide bores 3 are preferably arranged in accordance with an individual pattern which corresponds to the test object. The individual pattern is realized in accordance with the electric connections to be contacted on the test object, and so it is possible that the contact elements 4, with regard to their longitudinal extension are not parallel but run obliquely to one another.

The contact elements 4, which are configured particularly as buckling wires, can be microsystem-technical contact elements 4, i.e. they have tiny measurements.

It is basically possible to also provide severable, particularly laser-severable conductors 39 at the third contact surfaces 18, the first contact components 25, the second contact components 28 and/or the contact means, i.e. electric conductors 39 are also present between the individual elements, wherein at least one of these conductors 39 is severed, particularly laser-severed.

Figure 6:
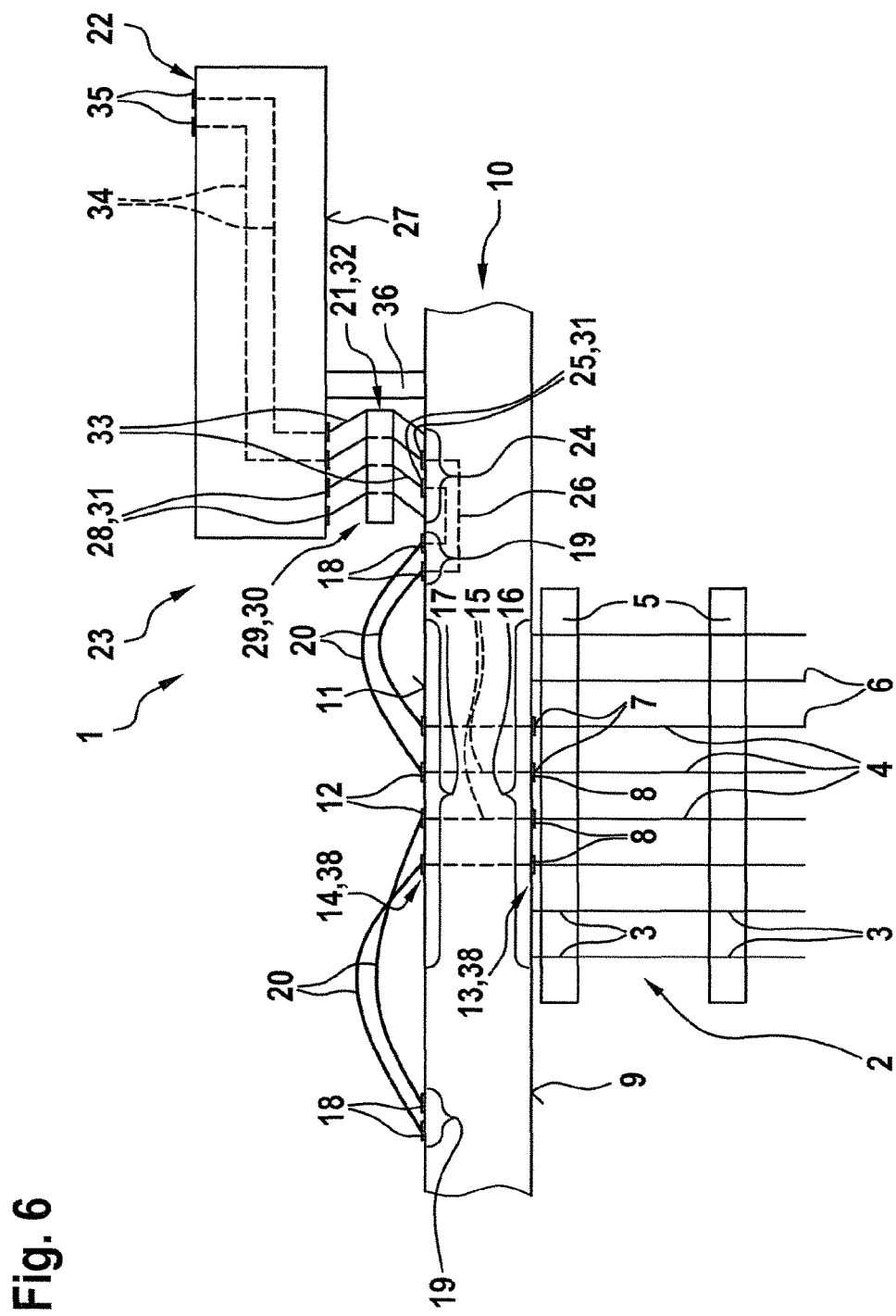
FIG. 6 shows a further embodiment of the contact device, partially sectional.

FIG. 6 shows a further embodiment of the invention which substantially corresponds to the embodiment of FIG. 1, and so reference is made to the greatest extent to the embodiment of FIG. 1 and the associated description. It is different only because the conductor board 22 is not associated with the one face 9 of the printed circuit board 10 but with the other face 11 of the printed circuit board 10. Furthermore, the second contact components 28 and the fifth contact surfaces 35 do particularly not lie on the same side of the conductor board 22 (FIG. 1) but on opposite sides of the conductor board 22 (FIG. 6).

For all embodiments applies that a test object is lifted by means of a lifting table for conducting the electric test and is forced toward the ends 6 of the contact elements 4, resulting in electric contacts. By means of the aforementioned test device, electric circuits can subsequently be connected by means of the contact device in order to test the electric test object, particularly a wafer, for electric functionality.

The invention claimed is:

1. A contact device for an electric contact for electrically testing an electric test object, the contact device comprising:
   at least one printed circuit board;
   a contact head having a plurality of guide bores, in which elongated contact elements that buckle elastically in a lateral direction upon contacting the test object, are mounted in a longitudinally movable manner; one end of the contact element used to contact the test object and another end of the contact element in contact with first contact surfaces which are arranged in a specified pattern and which are located on a face of the printed circuit board in a first central region of the printed circuit board face;
   second contact surfaces arranged in a further specified pattern are electrically connected to the first contact surfaces through the printed circuit board and lie on the other face of the printed circuit board in a second central region of the printed circuit board face;
   third contact surfaces lying on the other face of the printed circuit board in at least one first peripheral portion of the printed circuit board face;
   wherein at least some of the second contact surfaces are electrically connected to at least some of the third contact surfaces by bonding wires;
   wherein at least some of the first contact surfaces and/or at least some of the second contact surfaces are each electrically connected to one another by severable conductors, and at least one of the conductors is severed, and
   wherein the first contact surfaces are directly connected to the second contact surfaces by first through-connections, the specified pattern of the arrangement of the first contact surfaces and/or the specified further pattern of the second contact surfaces is each a two-dimensional matrix pattern, the severable conductors are arranged in a matrix-like pattern.

2. The contact device according to claim 1, wherein the severable conductors are configured as conductor paths or conductor webs.

3. The contact device according to claim 1, wherein the at least one severed conductor is laser-severed.

4. The contact device according to claim 1, further comprising at least one conductor board, wherein the third contact surfaces are electrically connected to the conductor board.

5. The contact device according to claim 1, further comprising first contact components lying on the one face of the printed circuit board in at least a second, peripheral portion of the printed circuit board face which are electrically connected to the third contact surfaces through the printed circuit board; the conductor board comprises second contact components on the side facing the printed circuit board, and wherein the first contact components are electrically connected to the second contact components by electric connections, particularly elastically resilient contacts.

6. The contact device according to claim 1, further comprising first contact components lying on the other face of the printed circuit board in at least a second, peripheral portion of the printed circuit board face which are electrically connected to the third contact surfaces; the conductor board comprises second contact components on the side facing the printed circuit board, and wherein the first contact components are electrically connected to the second contact components by elastically resilient contacts.

7. The contact device according to claim 5, wherein the first contact components are electrically connected to the second contact components by at least one electric interposer.

8. The contact device according to claim 5, wherein the first contact components and/or the second contact components are fourth contact surfaces.

9. The contact device according to claim 5, wherein the first contact components and/or the second contact components are protruding first spring contacts.

10. The contact device according to claim 7, wherein the interposer comprises contact means on opposite sides which are configured as fifth contact surfaces and/or protruding second spring contacts.

11. The contact device according to claim 1, wherein the guide bores in the region of the printed circuit board are arranged in the specified pattern, particularly the two-dimensional matrix pattern.

12. The contact device according to claim 1, wherein the guide bores are arranged on the side of the test object in an individual pattern which corresponds to the test object.

13. The contact device according to claim 1, wherein at least some of the first through-connections each are composed of a plurality of first through-connection areas, wherein the first through-connection areas of these first through-connections each lie aligned or offset but at least to some extent overlapping to one another.

14. The contact device according to claim 1, wherein the third contact surfaces are connected to the first contact components by second through-connections.

15. The contact device according to claim 14, wherein at least some of the second through-connections are each composed of a plurality of second through-connection areas, wherein the second through-connection areas of these second through-connections each lie aligned or offset but at least to some extent overlapping to one another.

16. The contact device according to claim 1, wherein the second contact surfaces and the third contact surfaces lie at the same height.

17. The contact device according to claim 1, further comprising at least one replaceable spacer element of selectable thickness arranged between printed circuit board and conductor board for adjusting the height distance of printed circuit board and conductor board.

18. The contact device according to claim 1, wherein the contact elements are microsystem-technical contact elements.

19. The contact device according to claim 1, wherein the third contact surfaces, the first contact components, the second contact components and/or the contact means are each electrically connected to one another by laser-severable conductors, wherein at least one of the laser-severable conductors laser-severed.

* * * * *